United States Patent
Duryea

(10) Patent No.: US 11,996,843 B2
(45) Date of Patent: May 28, 2024

(54) REDUNDANT ANALOG BUILT-IN SELF TEST

(71) Applicant: Texas Instruments Incorporated, Dallas, TX (US)

(72) Inventor: Timothy Paul Duryea, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 139 days.

(21) Appl. No.: 17/567,711

(22) Filed: Jan. 3, 2022

(65) Prior Publication Data

US 2023/0216505 A1    Jul. 6, 2023

(51) Int. Cl.
H03K 19/23 (2006.01)
G01R 31/317 (2006.01)
H03H 7/06 (2006.01)
H03K 3/037 (2006.01)

(52) U.S. Cl.
CPC ....... *H03K 19/23* (2013.01); *G01R 31/31712* (2013.01); *H03H 7/06* (2013.01); *H03K 3/037* (2013.01)

(58) Field of Classification Search
CPC .................. H03K 19/23; H03K 19/00338
See application file for complete search history.

(56) References Cited

U.S. PATENT DOCUMENTS

| | | | |
|---|---|---|---|
| 4,375,683 A * | 3/1983 | Wensley | G06F 11/187 326/11 |
| 4,873,685 A | 10/1989 | Mills, Jr. | |
| 6,838,899 B2 | 1/2005 | Plants | |
| 7,173,448 B2 | 2/2007 | Plants | |
| 7,752,514 B2 | 7/2010 | Huisman et al. | |
| 8,140,923 B2 | 3/2012 | Goel et al. | |
| 9,163,387 B2 | 10/2015 | Yuan et al. | |
| 9,191,009 B1 * | 11/2015 | Clark | H03K 19/017509 |

FOREIGN PATENT DOCUMENTS

| | | |
|---|---|---|
| JP | 2000114388 A | 4/2000 |
| WO | WO87/06037 A1 | 10/1987 |

OTHER PUBLICATIONS

Notification of Transmittal of the International Search Report and the Written Opinion of the Internatiional Searching Authority, or the Declaratiion; PCT/US2023/010035; dated Jul. 10, 2023; 6 pages.

* cited by examiner

*Primary Examiner* — Vincent Q Nguyen
(74) *Attorney, Agent, or Firm* — Ray A. King; Frank D. Cimino

(57) ABSTRACT

Described embodiments include a test system having first, second and third circuits having the same design and configured to receive a same input signal. A majority voter circuit has a first voter input coupled to a first circuit output, a second voter input coupled to a second circuit output, a third voter input coupled to a third circuit output, and a voter output. The output signal is equal to a signal present at least two of the voter inputs. A discrepancy detector circuit has first, second and third discrepancy inputs coupled to the first, second and third circuit outputs, respectively. A discrepancy output is configured to: provide a first logic signal responsive to the first, second and third circuit outputs having equal values; and provide a second logic signal responsive to the first, second and third circuit outputs having unequal values.

14 Claims, 2 Drawing Sheets

REDUNDANT ANALOG BUILT-IN SELF TEST

BACKGROUND

This description relates to testability and fault detection in redundant circuits, such as triple redundant circuits in radiation hardened devices. Radiation hardened devices are useful for radiation immunity, such as in satellites, planes, missiles and spacecraft. For radiation-hardened designs, triple-redundant circuits are sometimes useful to protect critical signal paths against corruption or damage from radiation.

Damaging radiation events are transient, usually lasting in a range of 10-50 nsec. The radiation produces a short but very high current spike, which may cause the device to reset, or which may corrupt data within the device. For example, a radiation spike may cause a voltage regulator circuit to reset and turn off, thereby causing the system to shut down.

For critical signals, three instances of the same circuit may operate in parallel with the same inputs, and each of the three circuits having its own output. The three outputs are coupled to an input of a majority voter circuit block, which provides one output whose value represents at least two of the three parallel circuit outputs.

The triple redundant circuit may have a testability issue because even if only two of the three redundant circuits operate properly, the final output will be correct. Such a manufacturing defect increases a risk of a catastrophic failure if a radiation strike occurs during a mission causing a second one of the three redundant circuits to fail.

SUMMARY

In a first example, a test system includes first, second and third circuits having respective first, second and third circuit outputs. The first, second and third circuits have the same design and are configured to receive a same input signal. A majority voter circuit has a first voter input coupled to the first circuit output, a second voter input coupled to the second circuit output, a third voter input coupled to the third circuit output, and a voter output. The output signal is equal to a signal present at least two of: a first signal at the first voter input, a second signal at the second voter input, or a third signal at the third voter input.

A discrepancy detector circuit has a first discrepancy input coupled to the first circuit output, a second discrepancy input coupled to the second circuit output, a third discrepancy input coupled to the third circuit output, and a discrepancy output configured to: provide a first logic signal responsive to the first, second and third circuit outputs having equal values; and provide a second logic signal responsive to the first, second and third circuit outputs having unequal values. A latch has a latch input and a latch output. The latch input is coupled to the discrepancy output.

In a second example, a fault-detection circuit includes a first NOR gate having first, second and third NOR gate inputs and a first NOR gate output. The first, second and third NOR gate inputs are adapted to be coupled to respective outputs of three circuits having the same design.

An AND gate has first, second and third AND gate inputs and an AND gate output. The first, second and third AND gate inputs are adapted to be coupled respectively to the first, second and third NOR gate inputs. A second NOR gate has fourth and fifth NOR gate inputs and a second NOR gate output. The fourth NOR gate input is coupled to the AND gate output. The fifth NOR gate input is coupled to the first NOR gate output.

In a third example, a test circuit includes a majority voter circuit having a first voter input, a second voter input, a third voter input, and a voter output. The test circuit is configured to provide an output signal at the voter output. The output signal is equal to at least two of: a first signal at the first voter input, a second signal at the second voter input, or a third signal at the third voter input.

A discrepancy detector circuit has a first discrepancy input, a second discrepancy input, a third discrepancy input, and a discrepancy output. The discrepancy detector circuit is configured to: provide a first logic signal at the discrepancy output responsive to the first, second and third discrepancy inputs having equal values; and provide a second logic signal at the discrepancy output responsive to the first, second and third discrepancy inputs having unequal values. The second logic signal is opposite the first logic signal. A latch has a latch input and a latch output. The latch input is coupled to the discrepancy output.

DETAILED DESCRIPTION

In this description, the same reference numbers depict the same or similar (by function and/or structure) features. The drawings are not necessarily drawn to scale.

Radiation hardened devices are designed to have improved immunity to radiation events. Triple redundancy is sometimes used for critical signals in radiation hardened devices. In triple redundancy, three instances of the same circuit operate in parallel and have the same inputs, but each of the three circuits has its own respective output.

Figure 1:
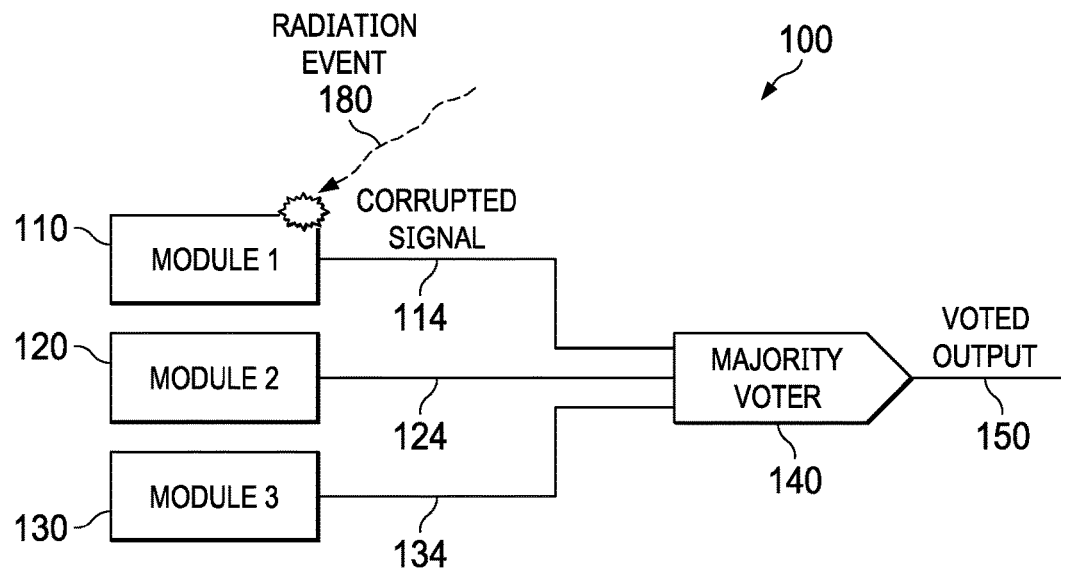
FIG. 1 shows a block diagram of an example for a triple redundant circuit.

FIG. 1 is a block diagram for an example triple redundant circuit 100. In triple redundant circuit 100, three circuits have the same design, namely: a module 1 110, a module 2 120 and a module 3 130. Module 1 110 has output 114. Module 2 120 has output 124. Module 3 130 has output 134. Preferably, outputs 114, 124 and 134 will have the same value. Outputs 114, 124 and 134 are coupled to inputs of a majority voter circuit block 140.

Majority voter block 140 may include AND OR gates. In some embodiments, a resistor-capacitor filter may be coupled to the output of majority voter block 140 to increase its immunity to a radiation strike, particularly if the output 150 is not a high-speed signal. The transistors of the majority voter block may be struck by a radiation event, but such occurrence is less likely than the triple redundant circuits being hit because the majority voter block 140 is a smaller cell, so a lower statistical probability exists of a particle landing there. Module 1 110, module 2 120 and module 3 130 may be analog circuit blocks that can include comparators, error amplifiers, and switching regulator circuits.

Majority voter circuit block 140 has an output 150 whose value is equal to a value of at least two of the three inputs. If inputs 114, 124 and 134 have the same value, then a value of output 150 will be the same as the value of inputs 114, 124 and 134. The three circuits may have slight timing delay differences. Accordingly, a settling time delay may be necessary to add before evaluating whether inputs 114, 124 and 134 have a same value.

For example, if module 1 110 is struck by radiation 180, output 114 may be corrupted, causing output 114 to be different than outputs 124 and 134. If outputs 124 and 134 have a same value, but output 114 has a different value, then a value of the output 150 of majority voter block 140 will be equal to the value of outputs 124 and 134.

If module 1 110 is struck by radiation 180 and its output 114 is corrupted, then a defect exists in one of the circuits, so one of the three circuits is nonfunctional. If two out of three circuits operate properly, production tests will pass the device, and the system that incorporates the device will operated correctly as long as both of the two working circuits operate correctly, and the circuit's fault may remain undetected. During a device level production test, the fault is hidden and may pass through the factory undetected, thereby leaving a risk of shipping (to a customer) a device with a faulty redundant circuit.

If such a device receives a radiation strike during a mission that damages one of the two working circuits, or if one of the two working circuits has a latent defect, then two of the three outputs will have an incorrect state, and the majority voter 140 will have an incorrect value at its output 150. A test gap exists in redundant circuits that can prevent accurate screening of manufacturing defects. One possible solution is a test mode that gives more visibility into defects of triple redundant circuits.

In a majority voter block, a test mode circuit can improve fault detection in triple redundant circuits. In the test mode circuit, digital combinational logic detects when the inputs of the majority voter block have unequal values. This can happen even with three properly functioning circuits because the three circuits may have slightly different delays. If there is a difference in values between the three inputs solely due to this delay, then it is not considered a fault. The test mode circuit should only identify disagreements between the circuits that persist for longer than the settling time of the circuits. However, if the three inputs disagree for a longer period than would be expected for transient conditions, then a potential manufacturing defect exists, and an appropriate response may be taken.

Figure 2:
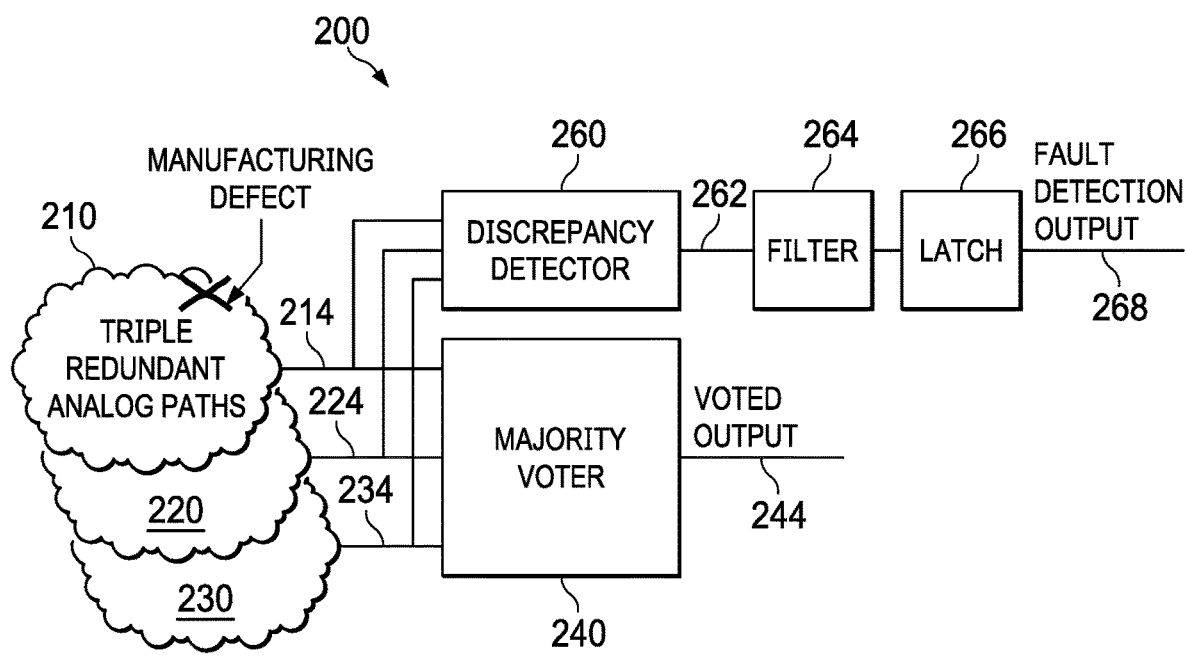
FIG. 2 is a block diagram of an example for a triple redundant circuit with improved testability.

FIG. 2 is a block diagram for an example triple redundant circuit 200 with improved testability. In triple redundant circuit 200, three analog circuits 210, 220 and 230 have a same design and have the same inputs. Circuit 1 210 has output 214. Circuit 2 220 has output 224. Circuit 3 230 has output 234. Preferably, outputs 214, 224 and 234 have a same value because circuits 210, 220 and 230 have the same design, including the same inputs. Outputs 214, 224 and 234 are coupled to inputs of majority voter circuit block 240.

Majority voter circuit block 240 has an output 250 whose value is equal to a value of at least two of the three inputs 214, 224 and 234. The majority voter block 240 may include AND and OR gates. If inputs 214, 224 and 234 have a same value, then the value of output 250 will equal the value of inputs 214, 224 and 234. If any of the inputs 214, 224 and 234 has a value different from the value of the other two inputs, then the value of output 250 will equal the value of the two same inputs. Slight timing differences may exist between the three circuits. A settling time delay may be necessary to add before majority voter circuit block 240 evaluates whether inputs 214, 224 and 234 have the same value. The output 244 of majority voter circuit 240 is used as the output of redundant circuits 210, 220 and 230.

Outputs 214, 224 and 234 from circuits 210, 220 and 230, respectively, are also couple to inputs of the discrepancy detector block 260. Discrepancy detector block 260 has an output 262 that is low when inputs 214, 224 and 234 have a same value, and is high when the value of any of inputs 214, 224 and 234 has a value different from the other two inputs. The output 262 of discrepancy detector 260 indicates a discrepancy between the outputs of redundant circuits 210, 220 and 230. A discrepancy between the outputs of redundant circuits 210, 220 and 230 indicates that a defect may exist in at least one of circuits 210, 220 and 230, and a suitable action can be taken.

The circuits 210, 220 and 230 may have slight timing differences. Accordingly, the output 262 of discrepancy detector 260 may be filtered to ensure that discrepancy detector 260 does not indicate a defect in response to a transient condition. The output 262 of discrepancy detector 260 is coupled to the input of filter 264, which in some embodiments may be a resistor-capacitor lowpass filter. The values of the filter components are chosen to ensure that the filter time constant is much longer than the uncertainty time between the three circuits. In at least some instances, the uncertainty time between the circuits is in the range of 50-100 nanoseconds.

The output of filter 264 is coupled to the input of latch 266, which latches in the value at its input. A high signal on the output 268 of latch 266 indicates that at least one of circuits 210, 220 and 230 has a defect. While a high signal on output 268 does not indicate which of the three circuits is defective, that information is not important to know in most instances because the device will likely be discarded regardless of which of the three circuits is defective.

Figure 3:
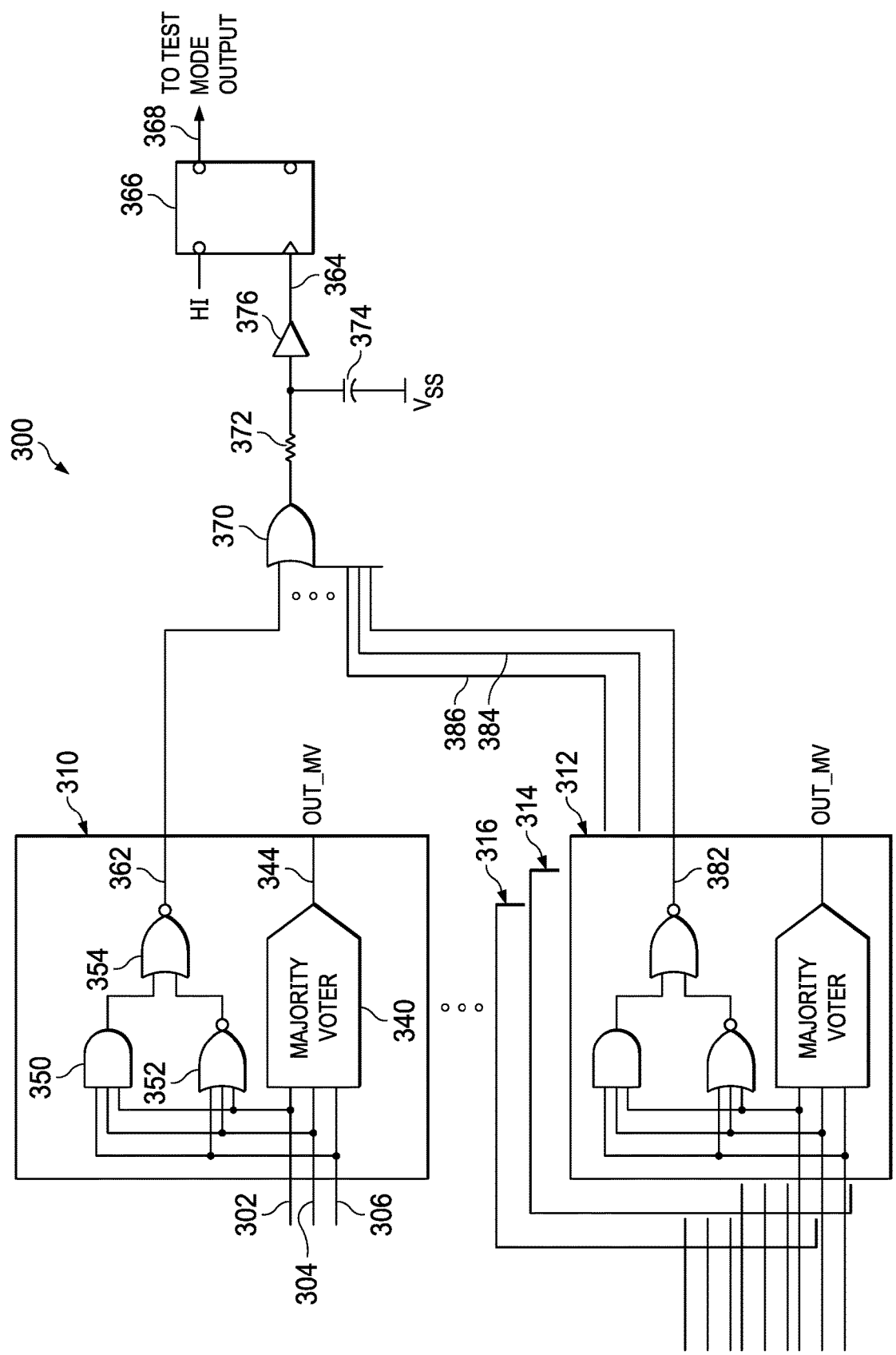
FIG. 3 is a block diagram of an example implementation for a system with a majority voter circuit having a redundant circuit discrepancy detector.

FIG. 3 is a block diagram of an example implementation for a system 300 using a majority voter circuit having a redundant circuit discrepancy detector. System 300 includes circuits 310, 312, 314 and 316. Each of circuits 310, 312, 314 and 316 have the same design, but they receive different sets of triple redundant inputs from different analog circuits.

Circuit 310 has the same circuitry as, and is thus representative of, circuits 312, 314 and 316. Circuit 310 includes majority voter circuit 340, which is coupled to triple redundant inputs 302, 304 and 306 from three analog circuits having a same design. Preferably, inputs 302, 304 and 306 would be the same because the circuits that provide them have a same design.

Majority voter circuit block 340 has an output 344 having a value that is equal to the value of at least two of the three inputs 302, 304 and 306. The majority voter block 340 may include AND and OR gates. If the values of inputs 302, 304 and 306 are the same, then the value of output 344 will be the same as the value of inputs 302, 304 and 306. If the value of any of the inputs 302, 304 and 306 is different from the value of the other two inputs, then the value of output 344 will be the same as the value of the two inputs that are the same. The output 344 of majority voter circuit 340 is used as the output of the redundant circuits to which inputs 302, 304 and 306 are coupled.

Inputs 302, 304 and 306 are coupled to inputs of a discrepancy detector. The discrepancy detector has an output 362 that is low when inputs 302, 304 and 306 have a same value, and is high when the value of any of inputs 302, 304 and 306 is not the same as the value of the other two inputs. The output 362 of the discrepancy detector flags a discrepancy between the outputs of redundant circuits to which inputs 302, 304 and 306 are coupled. A discrepancy between inputs 302, 304 and 306 provides an indication that a manufacturing defect may exist in at least one of circuits to which inputs 302, 304 and 306 are coupled, and a suitable action can then be taken.

The discrepancy detector has AND gate 350 and NOR gates 352 and 354. Inputs 302, 304 and 306 are coupled to the inputs of AND gate 350 and the inputs of NOR gate 352. The output of AND gate 350 will be low unless inputs 302, 304 and 306 are all high. The output of NOR gate 352 will be low unless inputs 302, 304 and 306 are all low. The outputs of AND gate 350 and NOR gate 352 are coupled to the inputs of NOR gate 354. The output 362 of NOR gate 354 will be high unless each of inputs 302, 304 and 306 has a same value. The output 362 of the discrepancy detector flags a discrepancy between inputs 302, 304 and 306.

The output 362 of the discrepancy detector may be filtered to ensure that the discrepancy detector does not trigger on a transient condition of inputs 302, 304 and 306. The output of the filter can be latched to record any faults detected.

Circuits 312, 314 and 316 each have a majority voter block and a discrepancy detector. As is the case with circuit 310, circuits 312, 314 and 316 may be filtered to remove any transients on the output of the discrepancy detector, and include a latch to record any faults detected. Instead of circuits 310, 312, 314 and 316 having separate filters and separate latches, the outputs of each discrepancy detector can be OR'd together to provide a single discrepancy detector output for all the circuits combined. This approach saves silicon area and the cost associated with the silicon area for the shared filters, buffers and latches.

The outputs, which include 362, 382, 384 and 386, of each of the discrepancy detectors are coupled to inputs of OR gate 370. The output of OR gate 37 is coupled to the input of a filter that includes resistor 372 and capacitor 374. The values of resistor 372 and capacitor 374 are chosen to provide a filter time constant much larger than the uncertainty time between circuits due to transients and delays. The output of the filter is coupled to the input of buffer driver 376. The output of buffer driver 376 is coupled to the input of latch 366. The latch 366 stores the filtered combined voter dissent signal. The output 368 of latch 366 provides a flag indicating whether any of the triple redundant inputs of circuits 310, 312, 314 or 316 disagrees with the other two inputs in its circuit.

In another example embodiment, OR gate 370 can be replaced by a "wired-OR" configuration with pull-up resistors on each of the discrepancy detector output lines. In yet another example embodiment, OR gate 370 can be replaced by distributed logic gates that perform the conceptual OR function.

This method is also useful for other applications beyond just factory production acceptance testing. This method can be useful for detecting defects in triple redundant circuits during mission-mode built in self-test (BIST), and for functional safety devices that must be radiation-hard, such as manned spacecraft. Some defects, such as a particle on a gate oxide, can make the gate oxide slightly thinner than it should be, yet they do not immediately manifest themselves. Normally, an oxide layer may last around ten years. However, with a thinner gate oxide, it may not last more than a few days. The device could pass the initial manufacturer device test and be shipped to a customer. Due to the triple redundancy, the device may also pass the customer's acceptance test because two out of three circuits are working, and the majority voter circuit will provide a correct value at its output. However, if the device gets hit with radiation during a mission, causing a second of the three redundant circuits to fail, the device discrepancy detector output could provide a fault flag notifying the system so appropriate failsafe actions can avert a catastrophic outcome. This allows continuously monitoring the system for latent defects, which can be useful in systems having functional safety and radiation concerns.

As used herein, "terminal", "node", "interconnection", "lead" and "pin" are used interchangeably. Unless specifically stated to the contrary, these terms generally mean an interconnection between or a terminus of a device element, a circuit element, an integrated circuit, a device, or other electronics or semiconductor component.

In this description, "ground" includes a chassis ground, an Earth ground, a floating ground, a virtual ground, a digital ground, a common ground, and/or any other form of ground connection applicable to, or suitable for, the teachings of this description.

In this description, even if operations are described in a particular order, some operations may be optional, and the operations are not necessarily required to be performed in that particular order to achieve desirable results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. A test system comprising:
    first, second and third circuits having respective first, second and third circuit outputs, the first second and third circuits having a same design, and each circuit configured to receive a same input signal;
    a majority voter circuit having a first voter input, a second voter input, a third voter input and a voter output, the first voter input coupled to the first circuit output, the second voter input coupled to the second circuit output, and the third voter input coupled to the third circuit output, wherein the voter output is configured to provide an output signal at the voter output that is equal to at least two of: a first signal at the first voter input, a second signal at the second voter input, or a third signal at the third voter input;
    a discrepancy detector circuit having first, second and third discrepancy inputs and a discrepancy output, the first discrepancy input is coupled to the first circuit output, the second discrepancy input is coupled to the second circuit output, and the third discrepancy input is coupled to the third circuit output, wherein the discrepancy output is configured to: provide a first logic signal responsive to the first, second and third circuit outputs having equal values; and provide a second logic signal responsive to the first, second and third circuit outputs having unequal values, the second logic signal being opposite the first logic signal; and
    a latch having a latch input and a latch output, the latch input coupled to the discrepancy output.

2. The system of claim 1, also comprising a filter having a filter input and a filter output,
    the filter input coupled to the discrepancy output, and the filter output coupled to the latch input.

3. The system of claim 2, wherein the filter includes a resistor-capacitor filter.

4. The system of claim 1, wherein the majority voter circuit includes OR logic gates and AND logic gates.

5. The system of claim 1, wherein the discrepancy detector circuit includes an AND logic gate and two NOR logic gates.

6. The system of claim 1, wherein the voter output will be equal to the first circuit output responsive to the first, second and third circuit outputs having equal values, and the voter output will be equal to the second circuit output responsive to the second and third circuit outputs having the same value but a different value than the first circuit output.

7. The system of claim 1, wherein a high signal on the latch output indicates a fault in at least one of the first, second or third circuits.

8. The system of claim 2, wherein a driver circuit is coupled between the filter output and the latch input.

9. A test circuit comprising:
   a majority voter circuit having a first voter input configured to receive a first signal, a second voter input configured to receive a second signal, a third voter input configured to receive a third signal, and a voter output that is configured to provide an output signal equal to at least two of the first signal, the second signal and the third signal;
   a discrepancy detector circuit having a first discrepancy input configured to receive the first signal, a second discrepancy input configured to receive the second signal, a third discrepancy input configured to receive the third signal, and a discrepancy output, wherein the discrepancy output is configured to provide a first logic signal responsive to the first, second and third signals being equal, and provide a second logic signal responsive to the first, second and third circuit signals being unequal, the second logic signal being opposite the first logic signal; and
   a latch having a latch input and a latch output, the latch input coupled to the discrepancy output.

10. The circuit of claim 9, also comprising a filter having a filter input and a filter output, the filter input coupled to the discrepancy output, and the filter output coupled to the latch input.

11. The circuit of claim 9, wherein the discrepancy detector circuit includes an AND logic gate and two NOR logic gates.

12. The circuit of claim 9, wherein the majority voter circuit includes OR logic gates and AND logic gates.

13. The circuit of claim 9, wherein the voter output will be equal to the first signal responsive to the first, second and third signals having equal values, and the voter output will be equal to the second signal responsive to the second and third signals having equal values but having an unequal value to the first signal.

14. The circuit of claim 9, wherein a high signal on the latch output indicates a fault in a circuit providing at least one of the first, second or third signals.

* * * * *